United States Patent
Jones et al.

(10) Patent No.: US 6,700,795 B1
(45) Date of Patent: Mar. 2, 2004

(54) SCALABLE, MODULAR ARCHITECTURE FOR AUTOMOTIVE POWER DISTRIBUTION AND BODY CONTROL FUNCTIONS

(75) Inventors: James L. Jones, White Lake, MI (US); Jarrett Nyschick, Westland, MI (US); Chidambarakrishnan L. Rajesh, Canton, MI (US); Kenneth J. Russel, Westland, MI (US); Yongmin Sheng, Novi, MI (US)

(73) Assignee: Yazaki North America, Canton, MI (US)

( * ) Notice: Subject to any disclaimer, the term of this patent is extended or adjusted under 35 U.S.C. 154(b) by 0 days.

(21) Appl. No.: 10/055,563

(22) Filed: Jan. 23, 2002

(51) Int. Cl.[7] .............................. H05K 1/11; H05K 1/14
(52) U.S. Cl. ....................... 361/784; 361/803; 361/826; 307/10.8
(58) Field of Search ................................. 361/784–785, 361/803, 825–826; 307/9.1, 10.1, 10.8

(56) References Cited

U.S. PATENT DOCUMENTS

| | | | |
|---|---|---|---|
| 4,685,753 A | * 8/1987 | Isshiki et al. .................. 439/74 |
| 4,811,168 A | * 3/1989 | Chesnut et al. ............. 361/752 |
| 4,942,571 A | 7/1990 | Möller et al. |
| 5,251,211 A | 10/1993 | Mutoh et al. |
| 5,508,689 A | 4/1996 | Rado et al. |
| 5,513,077 A | 4/1996 | Stribel |
| 5,623,169 A | 4/1997 | Sugimoto et al. |
| 5,670,845 A | 9/1997 | Grant et al. |
| 5,818,673 A | 10/1998 | Matsumaru et al. |
| 5,870,284 A | * 2/1999 | Stewart et al. .............. 361/699 |
| 5,990,573 A | 11/1999 | Granitz et al. |
| 5,999,104 A | 12/1999 | Symanow et al. |
| 6,007,351 A | * 12/1999 | Gabrisko et al. .......... 439/76.2 |
| 6,166,453 A | 12/2000 | Salto |
| 6,188,583 B1 | * 2/2001 | Fendt et al. ................. 361/796 |
| 6,249,060 B1 | 6/2001 | Osha |
| 6,420,797 B1 | * 7/2002 | Steele et al. .................. 307/9.1 |
| 6,528,899 B1 | * 3/2003 | Saito et al. ................. 307/10.1 |

* cited by examiner

Primary Examiner—Kamand Cuneo
Assistant Examiner—Tuan Dinh
(74) Attorney, Agent, or Firm—Young & Basile P.C.

(57) ABSTRACT

The architecture of an automotive wiring, power distribution and accessory control system is described. The system comprises semi-custom two-tier nodes which are distributed in locations around the vehicle to service load devices associated with or found in different regions of the automobile topology. A multiplexed control network interconnects the nodes along with a two-wire bus. Each node consists of a first common board carrying a microcontroller and a basic number of FET driver switches associated with a basic level of accessorization for that region of the vehicle. Each node further comprises a second larger pass through board which supports the first common board in spaced parallel relationship therewith and which carries terminal connectors. The larger pass through board has vacant locations for the addition of FET drivers needed for higher levels of accessorization. These locations are preconnected to the microcontroller but are unused in vehicles with lower levels of accessorization. The pass through board is also used to optimize the wiring by incorporation of splices and pass through circuits to eliminate wire harness interconnections.

17 Claims, 4 Drawing Sheets

SCALABLE, MODULAR ARCHITECTURE FOR AUTOMOTIVE POWER DISTRIBUTION AND BODY CONTROL FUNCTIONS

FIELD OF THE INVENTION

This invention relates to automotive electrical wiring, power distribution and control systems and more particularly to such a system including semi standardized nodes disposed in strategic vehicle regions and associated with groups of electrical load devices in those regions.

BACKGROUND OF THE INVENTION

Automotive electrical systems have evolved from the simplest level involving a battery and lights to a more complex level in which the typical passenger vehicle includes a battery, a power distribution center, one or more junction boxes and an extensive array and assortment of accessories including exterior and interior lights, radios, CD players, navigation systems, engine controls, computers, window lifts, ABS, door locks, power mirrors, heating and air-conditioning systems, heated seats, sun roofs, powered sliding doors, power rear deck lifts and other electronic devices.

Among these accessories, hereinafter called "electrical load devices," some are considered "basic" accessories; i.e., accessories which are factory installed on all vehicles in a given vehicle line. These might include radios, engine controls, heaters, some interior lights, exterior lights, wipers and horn. Other accessories such as power window lifts, ABS, heated seats, fog lights, remote entry and air-conditioning may be "premium" accessories which are routinely installed on premium vehicle lines and are extra cost, special order options on basic lines. Still other accessories are almost always extra cost options. These may include sun roofs, CD players and satellite navigation systems. Wiring harnesses and circuit boards must be individually designed for each accessorization level.

Moreover, it has become desirable to add more sophisticated control features to existing load devices. For example, it is now deemed essential in many vehicle lines to program interior lights to extinguish in a gradual, progressive fashion rather than in the more abrupt fashion associated with common ON/OFF switches. To achieve this type of control as well as to provide for multiple speed settings for such loads as blower motors it has become common to control the application of power to load devices with high-side and low-side switches such as FETs connected to a microcontroller chip which can be programmed to provide the desired input/output transfer characteristic.

To achieve all of the functions in a modem high-level automobile and to provide electrical wiring harnesses and control systems in an economic, repeatable fashion with minimal custom design is a formidable task.

SUMMARY OF THE INVENTION

According to the present invention the architecture of an automotive wiring, power distribution and control system is chosen to arrange load devices in groups and control such devices by nodes which are strategically placed in each of several vehicle regions to service the individual groups of load devices. In the preferred form, the nodes are designed in a "two-tier" fashion to include in each case a first circuit board which is of fixed configuration and which carries a microcontroller and a number of power switches such as FETs at least equal in number to the number of load devices associated with the basic level of accessorization in a specific vehicle region. In addition, each node comprises a second circuit board with terminal connectors to permit it to receive inputs from, for example, a control area network (CAN) as well as power from the vehicle battery and alternator. In addition the boards include splicing of pass through circuits and interconnections between the first and second boards so the CAN signals can reach the microcontrollers to which they are addressed. The interconnections also carry the FET outputs to a terminal connector on the second board so they can be directed to load devices in the region serviced by a given node.

There are numerous advantages arising out of this arrangement. For example, the first circuit board can be standardized and "qualified" for all vehicles in a line or for vehicles in different lines even though such vehicles may have different levels of accessorization. To this end, the second circuit board is preferably provided with vacant locations for additional power switches such as FETs and additional inputs, which locations are pre-connected by, for exarnple, traces and interconnects to the microcontroller on the first board as well as by traces to an output terminal connector to permit expansion of the accessorization level of any node without affecting the fixed design or load carrying capability of the first circuit board.

In this application, the word "qualified," as it applies to the first circuit board, refers to the determination that the first board provides adequate heat dissipation for the power switching devices, adequate separation of the power devices from the microcontroller and adequate protection of the microcontroller from field effects created by other nearby components.

In a preferred form, the first circuit board is standardized as to size and the FET switches thereon are arranged in a discrete group which is spaced on the board from the microcontroller. Moreover, the second circuit board is provided not only with traces but also with pin-type circuit board interconnects such that the first circuit board can be mounted to and on the second circuit board in parallel spaced relationship to permit air flow between them as well as temperature and field isolation therebetween. The second circuit board is provided with peripheral terminal connectors of standard design secured to the board and electrically connected to traces on the second circuit board by means of L-shaped rigid electrical conductors such that the second circuit board can be connected to receive dc power and control signals on the CAN. The terminal connectors also provide for interconnection of the FET switches to the load devices as well as interfaces to switches and other control interconnections between nodes for networking. As stated above, the second circuit board preferably further includes vacant power switch device locations which are pre-connected by traces to the pin interconnects extending between the second circuit board and the first circuit board such that the vacant power switch device locations, when filled, are pre-connected to the microcontroller. Therefore, to reconfigure a given node for additional load devices requires only the addition of FETs to the second circuit board and flash reprogramming of the microcontroller to put the added FET switches into service. It will be noted that this expansion or "reconfiguration" does not require redesign of the first circuit board and/or requalification thereof.

These and other advantages of the present invention will be better understood from reading the following detailed description of a specific and illustrative embodiment of the invention.

Other applications of the present invention will become apparent to those skilled in the art when the following description of the best mode contemplated for practicing the invention is read in conjunction with the accompanying drawings.

BRIEF DESCRIPTION OF THE DRAWINGS

The description herein makes reference to the accompanying drawings wherein like reference numerals refer to like parts throughout the several views, and wherein.

DETAILED DESCRIPTION OF THE ILLUSTRATIVE EMBODIMENT

Figure 1:
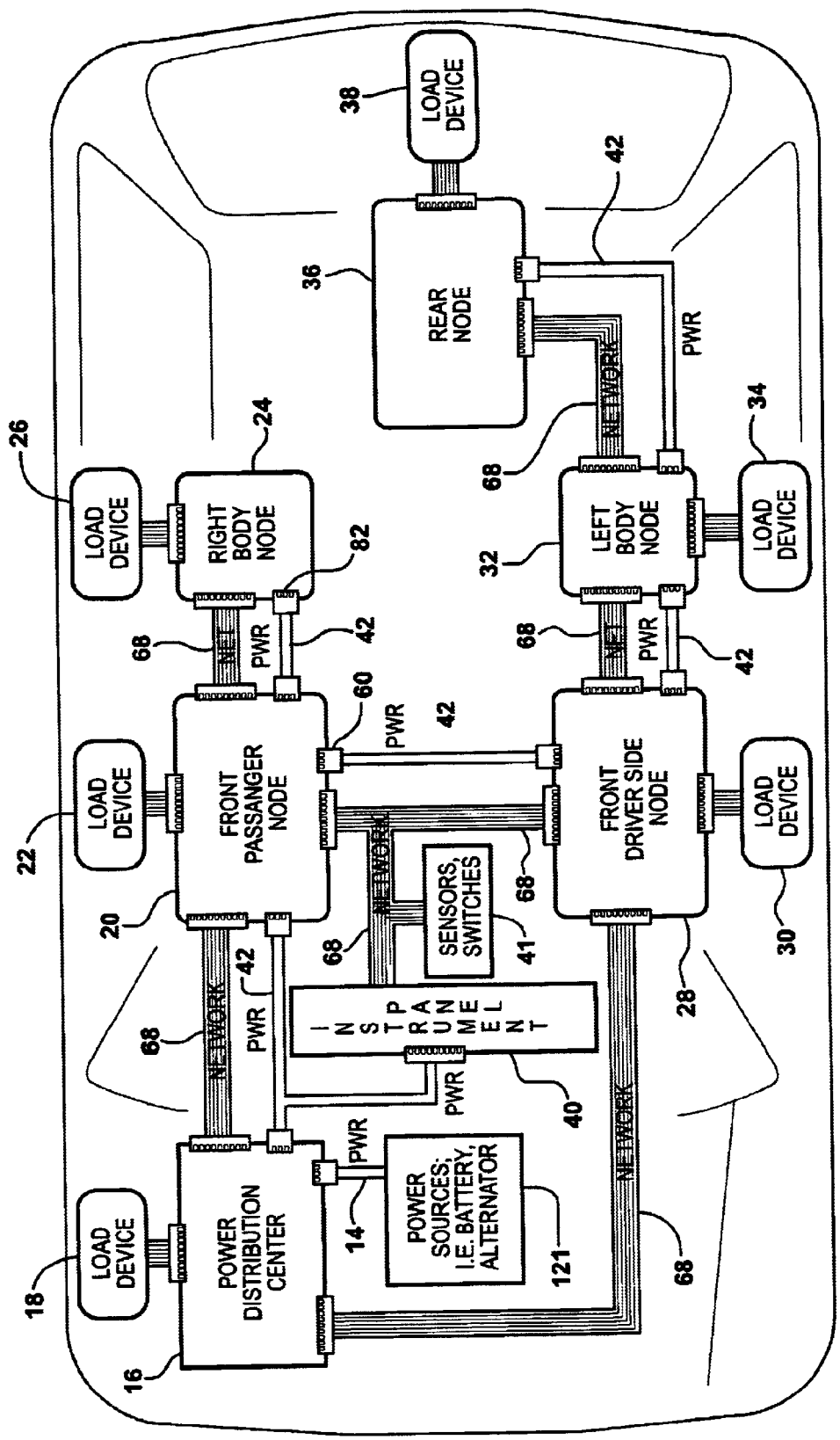
FIG. 1 is a plan view of an overall wiring, power distribution and control system architecture for a typical automotive vehicle.

Referring now to FIG. 1 an electrical system topology according to the present invention for an automobile 10 having its front or engine side at the left of the drawing and its rear at the right of the drawing is shown. The automobile 10 is assumed in this example to be a conventional internal combustion engine powered mini-van having power operated right and left side sliding doors (not shown) and a power rear gate (not shown). The electrical system comprises a front mounted power source group 12 including a battery of suitable size and an engine driven alternator. Power group 12 is connected by cable 14 to a power distribution center 16 comprising a conventional combination of fuses and relays. In this embodiment the power distribution center 16 further comprises an underhood node for servicing engine compartment load devices 18 such as fuel injectors, engine timing controls, air conditioning clutch and so forth. In addition, the system shown in FIG. 1 comprises a front passenger side node 20 serving load devices 22 such as interior lights, radio, passenger seat heat, passenger side mirror and purge solenoid. Premium level load devices may further include a CD player, power outlet, telephone and navigation system. The system further comprises a right side body node 24 servicing load devices 26 such as a power window operator and a right side sliding door control. The system further comprises a front driver side node 28 servicing load devices 30, a left side body node 32 servicing load devices 34 and a rear node 36 serving load devices 38. The load devices 30 for node 28 may include a driver's side seat heater, a driver's side mirror, the instrument cluster, wipers, interior lights, switch inputs and air bag actuators. The load devices 38 associated with node 36 may include a rear window defroster, rear deck lift, rear deck lock, rear cigarette lighters, power outlets and the like.

The electrical system further comprises an instrument panel 40 which comprises the instruments and a combination of input devices such as switches and output devices such as lights, sun roof controls and the like. The electrical system further comprises an assortment of sensors and switches 41 which may be distributed around the vehicle; these might include temperature sensors, glove compartment and door opening switches and the like.

The instrument panel switches may be related to load devices serviced (power-controlled) by nodes in a different region; the rear gate lock may be controlled by an instrument panel switch but power may be controlled by an FET switch in node 36. The underhood node 16 is connected by power lines 42 to the front passenger side node 20, the right side body node 24, the front driver side node 28, the left body side node 32, the rear node 36 and the instrument panel 40. This power connection is a simple two-wire pair capable of handling the currents associated with conventional automotive accessories as will be apparent to persons skilled in the art. The reference 42 is used on all of such power connections whether they be from the power underhood node 16 to another component or between nodes as shown.

It will be understood that the underhood node 16, front passenger side node 20, front driver side node 28 and rear node 38 are found in most vehicles whereas the right body node 24 and left body node 32 are typically only associated with special passenger vehicles such as vans having power sliding right and left side doors. Still further additional nodes may be associated with other specialty vehicles such as large SUVs or custom equipped vehicles. The electrical system architecture with the node design of the present invention may also be used in vehicles such as boats and airplanes.

The electrical system for the vehicle 10 further comprises a bus-type network 68 interconnecting all of the nodes as well as the instrument panel 40 and the sensors and switches group 41. As is well known to persons familiar with automotive electrical system architecture the network, in this case a Control Area Network or CAN, is a low voltage, multiplexed, multi-wire harness carrying data in the form of identification bits and control bits which are communicated between the aforementioned components during operation of the vehicle to perform automatic and operator induced control functions using intermediary microcontrollers rather than direct hardwire connections between switches and load devices. The protocols for such networked interconnections are described to varying degrees in numerous publications including "Multiplexed Buses Unravel Autowiring," Electronic Design, Aug. 8, 1991, pgs. 83–90; SAE recommended practice, Class B Data Communication Network Interface— SAE 11850, November 1988, pgs. 20.165 –20.169; "Automakers Move to Multiplexing," Machine Design, Jun. 8, 1989, No. 11, pgs. 102–108; "Multiplexed Development Strategy: Part I," Automotive Engineering, September 1990, No. 9, pgs. 63–65 and U.S. Pat. No. 5,508,689 issued Apr. 16, 1996 and assigned to the Ford Motor Company of Dearborn, Mich. As hereinafter described in greater detail with references to FIGS. 2, 3 and 4, the nodes 20, 24, 28, 32 and 36, along with power distribution center/underhood node 16, are equipped with terminal connectors of conventional design to accommodate the network and harness 68 and the power connection wires 42 in conventional fashion. Terminal connectors are also used to interconnect the nodes with their respective load device groups 22, 26, 33, 34 and 38 as shown in FIG. 1. The number of wires in each of these power connections and the number of pins in the terminal connectors will be a function of the maximum number of load devices to be controlled by any given node.

In operation of the system of FIG. 1, operator control switches and/or automatically activated sensors and switches produce coded data signals intended for the operation of specific load devices associated with and controlled by one of the six nodes disclosed in FIG. 1. The identification signal which is part of the data stream is particular to the microcontroller in the node which controls the selected load device and will be recognized only by that node. At the node, the data signal is used as an input to the microcontroller which, in accordance with the embedded software in the microcontroller, generates an output for one or more power-control switches in the node to deliver power in a controlled way to a selected load device associated with the addressed node. In this fashion, for example, a switch in the instrument panel 40 may be used to operate a load device in the group 38 through the node 36. This is achieved by generating a data signal on the network 68 which is recognized only by the node 36, decoded and acted upon by the microcontroller in the node 36 and used to operate one or more FET-type switches to activate a selected load device in the group 38.

Figure 2:
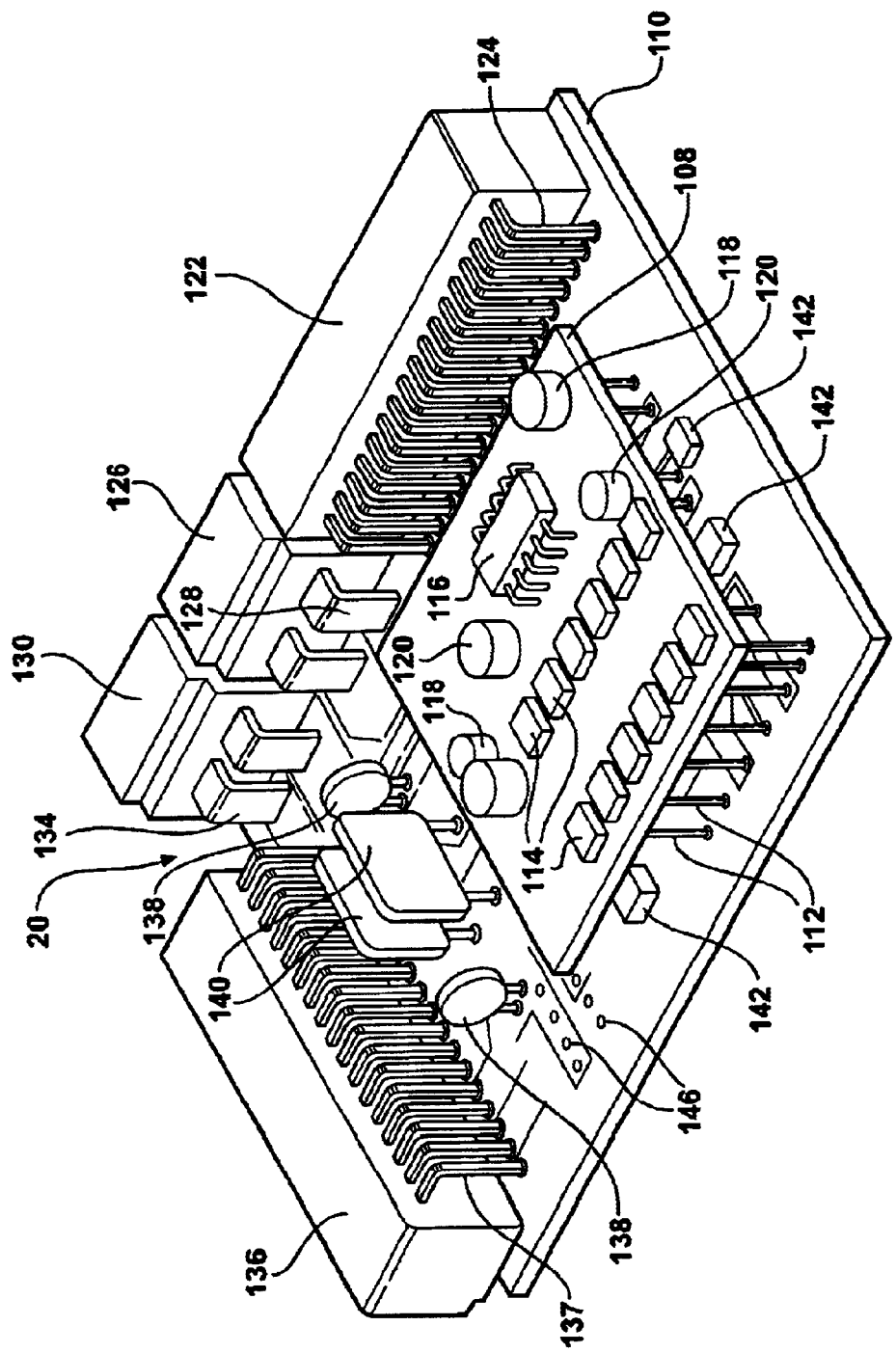
FIG. 2 is a perspective view of the arrangement of circuit boards in a typical node.
Figure 3:
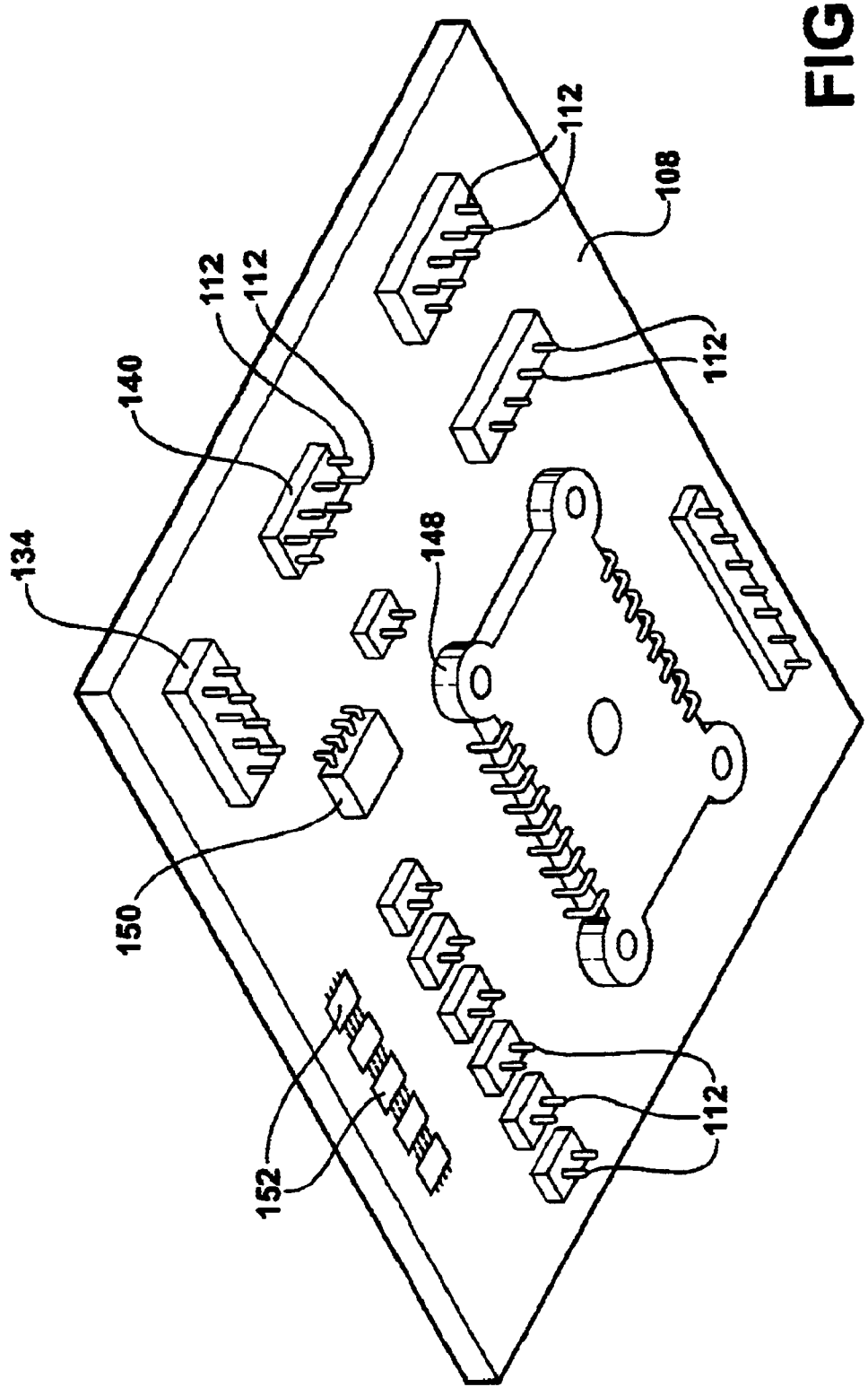
FIG. 3 is a perspective view of the underside of the first or common board in the arrangement of FIG. 2.
Figure 4:
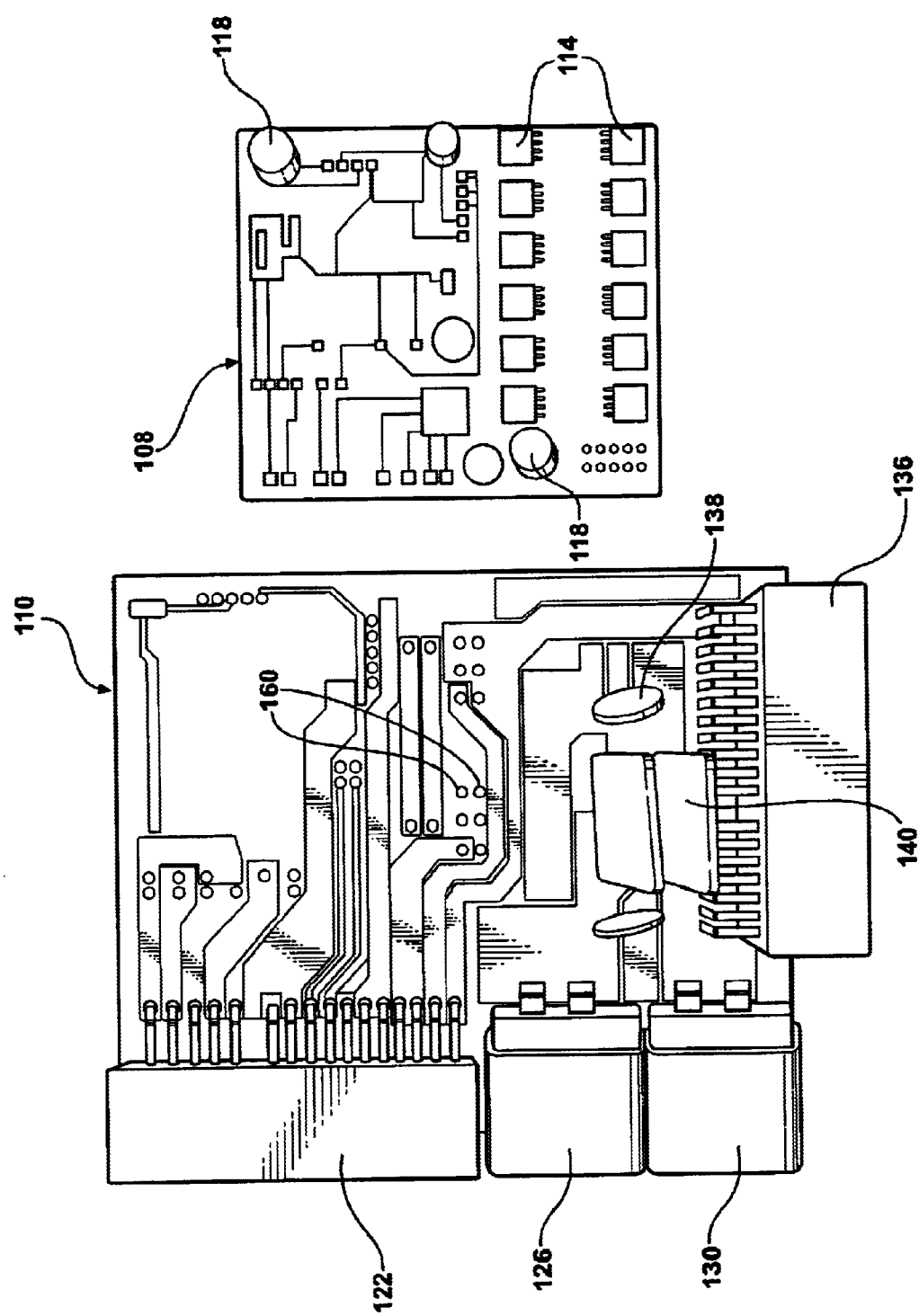
FIG. 4 is a plan view of the node circuit boards in a disconnected and separated state indicating the location of vacant switch locations in the second (larger) of the two boards.

Referring now to FIGS. 2–4, the preferred construction of a node will be described. The node hereinafter described can be any of the nodes 16, 20, 24, 28, 32 and 36 as all such nodes share a common basic construction and certain common components.

Looking to FIG. 2 the node 20 comprises a first circuit board 108 mounted in parallel spaced relationship to one side of a second larger circuit board 110 by way of rigid pin-pair circuit board interconnects 112 which are fixed to the board 108 and fit into small conductive pin-type openings in the board 110 where they are soldered or brazed in place. Board 108 carries a group of FET driver switches 114, in this case a group of 10 FET driver switches arranged in two parallel rows of five along one side of the board 108. As shown, the FET driver switches 114 are provided with heat sinks and are interconnected to a microcontroller 148 (FIG. 3) mounted on the bottom side of the board 108 identified by a location 116 which is physically separated from the group of FET driver switches 114. Additional circuit components such as resistors 118 and 120 are also mounted on the board 108. Traces on the board 108 interconnect the microcontroller 148 with the FET driver switches 114 to turn those switches on and off according to software embedded in the microcontroller when properly coded control signals are received by the microcontroller 148 on the board 110.

Board 110 is provided with a conventional wiring harness terminal connector 122 having rigid L-shaped conductors 124 interconnecting the terminals within the connector 122 to traces on the board 110 in conventional fashion. Power is received by the board 110 by way of a two-pin terminal connector 126 having rigid L-shaped conductors 128 connected to traces on the board 110 as shown. Power is routed from the board 110 to an adjacent node by way of terminal connector 130 having rigid L-shaped conductors 134 connected to appropriate traces on the board 110. The conductors 124, 128 and 134, in addition to providing electrical signal paths, also provide structural support for the terminal connectors 122, 126 and 130 relative to the board 110. Additional connections between the node and the outside world are made by way of multi-pin terminal connector 136 having rigid L-shaped conductors 137 connected to traces on the board 110. The terminal connectors provide means for data signals to reach the board 110 of the node 20, for power to come into and out of the node and for controlled power to be delivered to electrical load devices associated with the node 20.

It will be noted in FIG. 2 that the board 110 carries a number of additional electrical circuit components, metal oxide varistors 138, positive temperature coefficient resistors 140 and other miscellaneous components 142 some of which are located on the board 110 near and/or directly under the board 108. It will also be observed in FIG. 2 that the electrical interconnects 112, like the conductors 124, 128, 134 and 137, are used not only to provide electrical interconnections but also to provide structural support between the boards 108 and 110. In particular the board 108 is mounted in parallel spaced relationship with the top surface of the board 110 with a minimum spacing of about 4 mm between the highest surface of any of the components 142 and the lowest surface of the microcontroller 148 on the bottom of the board 110. This spacing provides for adequate air flow between the board and both thermal and electrical field isolation to ensure that the board 110, once qualified for both thermal and electrical field sensitivity aspects, is essentially unaffected by additions of components to the board 110 as hereinafter described. Board 110 is provided with vacant power switch locations 160 which are connected by traces or board 110 to conductors 137 and to the pin interconnects 112 and by additional traces on board 108 to microcontroller outputs. Locations 160 (FIG. 4) are vacant in nodes for "basic" or low-accessorization level vehicles and filled with FETs for premium or higher accessorization level vehicles.

As previously described, data signals on the CAN network harness 68 reach the node 20 by way of terminal connector 122 and reach the microcontroller 148 by means of traces on the board 110, interconnects 112 between the boards and additional traces on the board 108. Assuming these signals carry an identification which is recognized by the microcontroller 148 in the node 20, the microcontroller then outputs control signals to one or more of the FET driver switches 114 according to which load device has been selected as well as the performance characteristics which are desired for that load device. Once activated, the FET driver switches 114 open and close in a controlled sequence to send signals via the interconnects 112 and traces on the board 110 to the output terminal connector 136 which in turn is connected by means of a power cable to the selected load device.

As previously described, the first circuit board 108, is of fixed design and size that is common to all of the nodes in the system of FIG. 1. The number of FET drivers 114 is selected to accommodate all of the load devices in the group 22 no matter what the accessorization level of the vehicle 10. However, it is recognized that higher accessorization levels associated with some vehicles require additional FET driver switches exceeding the 10 switches which are provided on the board 108.

To accommodate this situation without requiring requalification of the board 108 as a result of the addition of more power devices, vacant pin-receiving socket pairs 146 are provided on the board 110 and are preconnected by traces on the boards 108 and 110 and the interconnects 112 to the microcontroller 148 as well as to the output terminal connector 136 and the input power terminal connector 126. In lower level accessorized vehicles, the spaces or locations 146 will remain vacant and unused. In vehicles with higher levels of accessorization, it is a simple matter to add FET driver switches to the locations 146 and flash program the microcontroller 148 to provide the appropriate transfer characteristics for the added accessories. The board 108 is, therefore, a "common board" in that it is common to all of the nodes without size or architectural change for the addition or deletion of components regardless of the accessorization level of the vehicle. The board 110, referred to as a "pass through board," is semi-customized in the sense that, while it remains of a single consistent size throughout the node architecture, and always carries a common board 108, provides vacant power device locations 160 which are preconnected to the microcontroller 148 associated with that node so that these locations can be pressed into service by the addition of FETs with minimal alteration to the manufacturing process for the particular node.

Referring to FIGS. 3 and 4 it can be seen that the microcontroller 148 is mounted to the bottom side of the board 108. It can also be seen that the rigid pin interconnects 112 for the FETs are arranged in a group which is spaced apart from the microcontroller 148 and also that other interconnects 112 associated with other devices on the board 108 are arranged around the undersurface of the board 108 so as to distribute the structural support for the board 108 relative to the board 110 relatively evenly among and between the four corners of the board. As shown in FIG. 3 the board 108 carries the CAN transceiver 150, a number of analog input filters 152 and other miscellaneous devices the character and function of which will be apparent to persons skilled in the art.

While the invention has been described in connection with what is presently considered to be the most practical and preferred embodiment, it is to be understood that the invention is not to be limited to the disclosed embodiments but, on the contrary, is intended to cover various modifications and equivalent arrangements included within the spirit and scope of the appended claims, which scope is to be accorded the broadest interpretation so as to encompass all such modifications and equivalent structures as is permitted under the law.

What is claimed is:

1. A wiring, power distribution, and control system for an automotive vehicle of the type having an electrical power source and a plurality of controllable load devices in different locations throughout the vehicle comprising:

a plurality of control nodes interconnected by a control signal network and power line, said control nodes being strategically placed in different regions in the vehicle to service selected groups of load devices associated with the individual node regions, each of said nodes comprises:
a first circuit board carrying a microcontroller having control signal inputs connected to said network, and power control signal outputs;
said first circuit board further carrying a plurality of power switches having input terminals being connected to the power control signal outputs of the microcontroller and output terminals being connected to specific load devices; and
a second circuit board having terminal connectors being connected to the control signal network, power lines and load devices; and means interconnecting the terminal connectors to the microcontroller for control signal input purposes and the power switches to the terminal connectors for power output purposes.

2. A system as defined in claim 1 wherein said interconnecting means includes traces on each of the first and second boards and interconnects between the boards.

3. A system as defined in claim 1 wherein the power switches are arranged in a group which is spaced apart from the microcontroller.

4. A system as defined in claim 1 further including power switch mounting locations on said second board and means interconnecting said locations to the power control signal outputs of the microcontroller.

5. A system as defined in claim 1 wherein the switches are FETs.

6. A system as defined in claim 1 wherein said plurality of nodes include a front passenger side node and a front driver side node.

7. A system as defined in claim 1 wherein the second circuit board further comprises means for signal connection between wire harnesses interconnecting the control nodes.

8. A system as defined in claim 2 wherein the interconnects between the boards are rigid pins serving to mount the first circuit board to the second circuit board in spaced relationship.

9. A system as defined in claim 2 wherein said switches are FETSs.

10. A system as defined in claim 6 wherein said plurality of nodes further includes a rear vehicle node.

11. A system as defined in claim 8 wherein the first circuit board is mounted on the second circuit board by way of said rigid interconnects in parallel spaced relationship to permit air flow therebetween.

12. A system as defined in claim 11 wherein the spacing between the first and second circuit boards is at least about 4 mm.

13. A power distribution and control node an apparatus for an automotive vehicle of the type having a control signal network comprising:

a first circuit board carrying a microcontroller having data signal inputs for connection to said network and power control signal outputs;
said first circuit board further carrying a plurality of power switches having power terminals for connection to load devices and control signal terminals connected to the power control outputs of the microcontroller; and
a second circuit board electrically interconnected with the first circuit board and carrying terminal connectors for connecting the network to the microcontroller and the switches to load devices, wherein said first circuit board is mounted on said second circuit board.

14. An apparatus as defined in claim 13 wherein the first and second circuit boards include electrically conductive traces thereon and rigid conductive circuit board interconnects therebetween such that the first circuit board is physically mounted on the second circuit board in spaced apart relationship.

15. An apparatus as defined in claim 13 wherein the second circuit board further includes additional vacant power switch mounting locations, and means interconnecting said locations to the control signal outputs of the microcontroller.

16. An apparatus as defined in claim 14 wherein the switches are arranged on the first circuit board in a group wherein each of the switches are proximate at least one other switch, the microcontroller being placed on the board so as to be remote from the switches.

17. An apparatus as defined in claim 16, wherein the switches are FETs.

* * * * *